(12) United States Patent
Kim et al.

(10) Patent No.: US 10,520,819 B2
(45) Date of Patent: Dec. 31, 2019

(54) SUBSTRATE TREATING APPARATUS AND METHOD OF TREATING SUBSTRATE

(71) Applicant: Samsung Display Co. Ltd., Yongin-si, Gyeonggi-do (KR)

(72) Inventors: Taegyun Kim, Hwaseong-si (KR); Minsuk Ko, Cheonan-si (KR); Koichi Sugitani, Hwaseong-si (KR); Yong-Hoon Yang, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/987,194

(22) Filed: May 23, 2018

(65) Prior Publication Data

US 2019/0155161 A1    May 23, 2019

(30) Foreign Application Priority Data

Nov. 17, 2017   (KR) .................. 10-2017-0154326

(51) Int. Cl.
| | | |
|---|---|---|
| *G03D 5/00* | (2006.01) | |
| *G03F 7/30* | (2006.01) | |
| *G03F 7/00* | (2006.01) | |
| *G03F 7/32* | (2006.01) | |
| *G03F 7/16* | (2006.01) | |

(52) U.S. Cl.
CPC .......... *G03F 7/3064* (2013.01); *G03F 7/0007* (2013.01); *G03F 7/16* (2013.01); *G03F 7/3071* (2013.01); *G03F 7/32* (2013.01)

(58) Field of Classification Search
USPC ...................................................... 396/611
See application file for complete search history.

(56) References Cited

U.S. PATENT DOCUMENTS

| 3,680,681 A | * | 8/1972 | Burk | .................... | B65G 39/10 |
| | | | | | 198/349 |
| 3,752,054 A | * | 8/1973 | Scanlan | ................. | G03B 15/00 |
| | | | | | 271/274 |
| 7,632,028 B2 | * | 12/2009 | Jeong | .................... | G02F 1/1303 |
| | | | | | 396/611 |
| 8,186,787 B2 | * | 5/2012 | Holbrook | ............... | B41J 25/308 |
| | | | | | 347/16 |
| 10,139,731 B2 | * | 11/2018 | Cheng | ..................... | G03F 7/30 |

(Continued)

FOREIGN PATENT DOCUMENTS

| JP | 2013-229419 A | 7/2013 |
|---|---|---|
| KR | 10-2009-0131251 A | 12/2009 |
| KR | 10-1399528 | 5/2014 |

(Continued)

*Primary Examiner* — Rodney E Fuller
(74) *Attorney, Agent, or Firm* — Innovation Counsel LLP

(57) ABSTRACT

A substrate treating apparatus includes a plurality of conveying rollers arranged in a first direction which is a horizontal direction, and configured to transfer a substrate in the first direction, the substrate being disposed on a plane formed by the first direction and a second direction perpendicular to the first direction, a developer providing nozzle configured to provide a developer onto the substrate to form a developer layer on the substrate, a sensor part for recognizing a position of the substrate, and a vertical moving part configured to move each of the conveying rollers along a third direction which is downward and perpendicular to the first and second directions.

20 Claims, 13 Drawing Sheets

(56) References Cited

U.S. PATENT DOCUMENTS

2014/0251172 A1* 9/2014 Sonokawa .............. G03F 7/029
　　　　　　　　　　　　　　　　　　　　　　101/463.1
2018/0188653 A1* 7/2018 Cheng ..................... G03F 7/30

FOREIGN PATENT DOCUMENTS

| KR | 10-1424437 | 7/2014 |
| KR | 10-2016-0012076 A | 2/2016 |

* cited by examiner

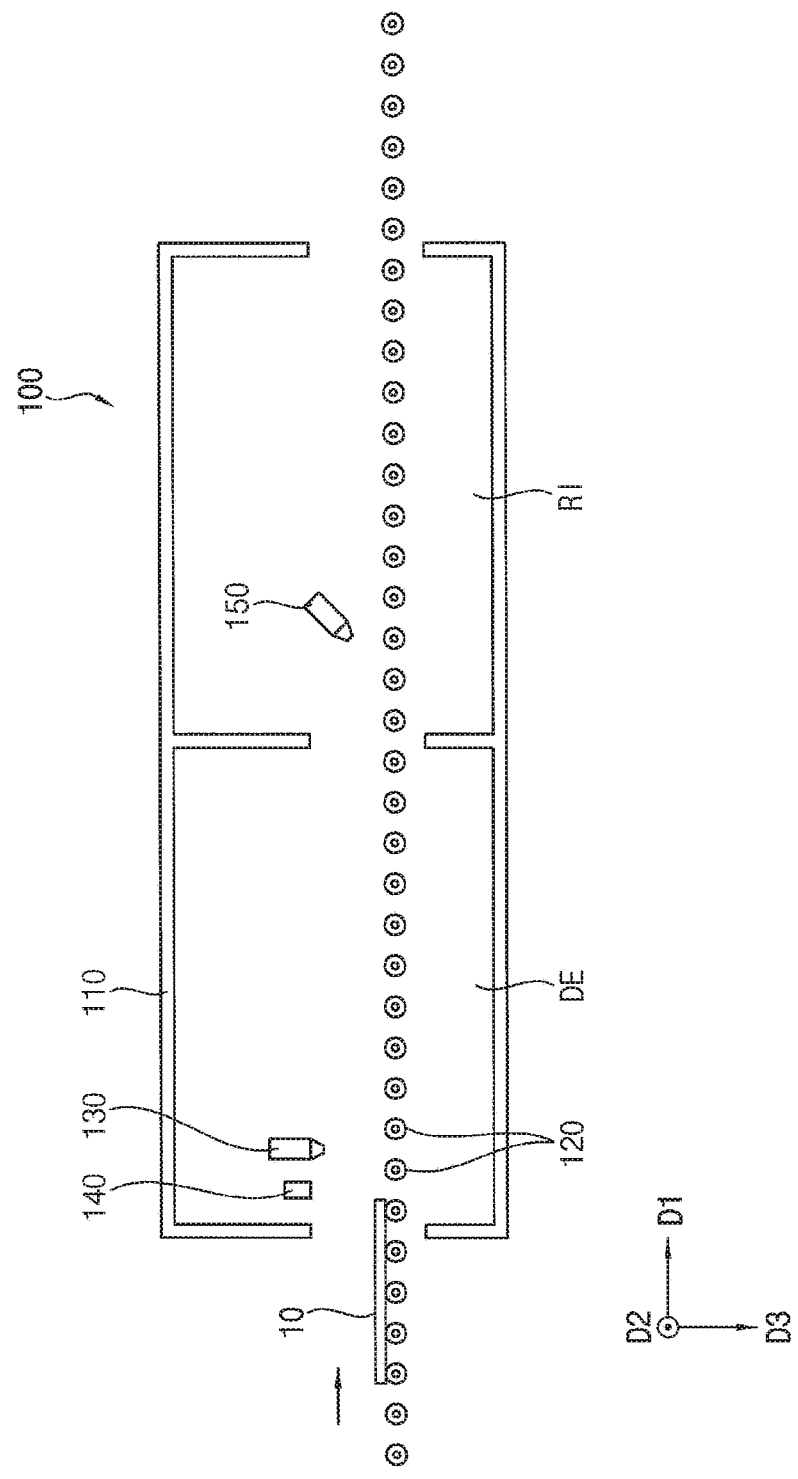

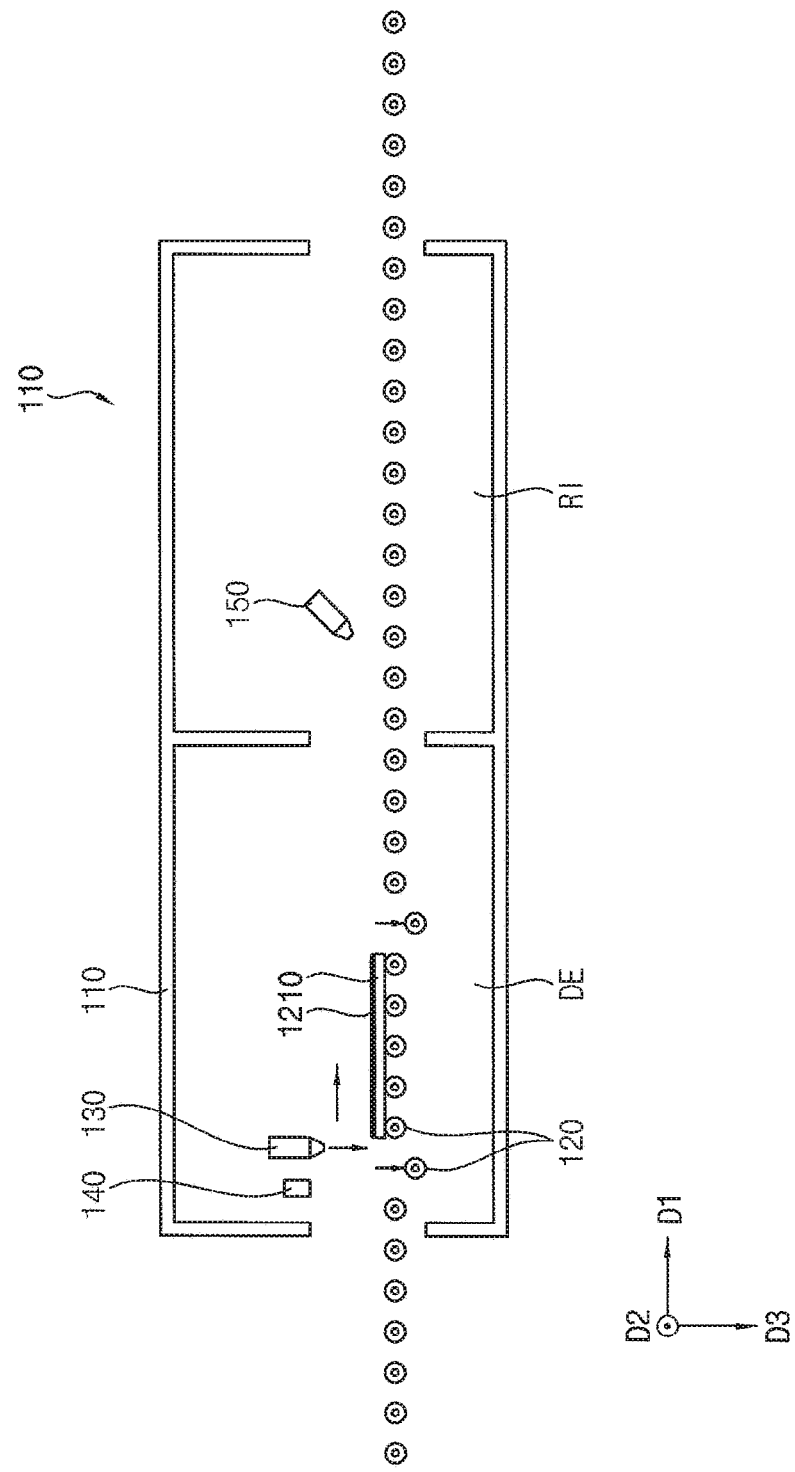

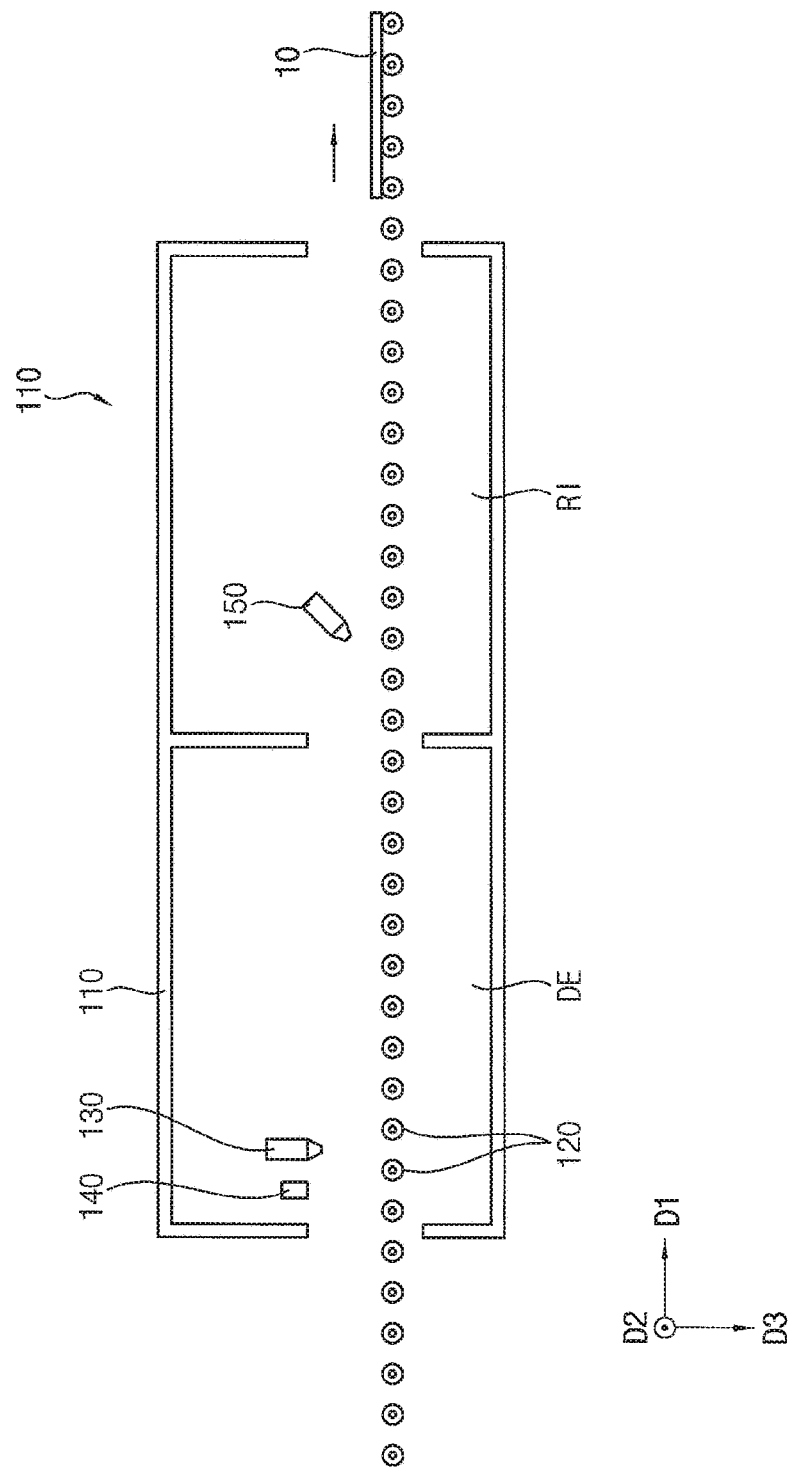

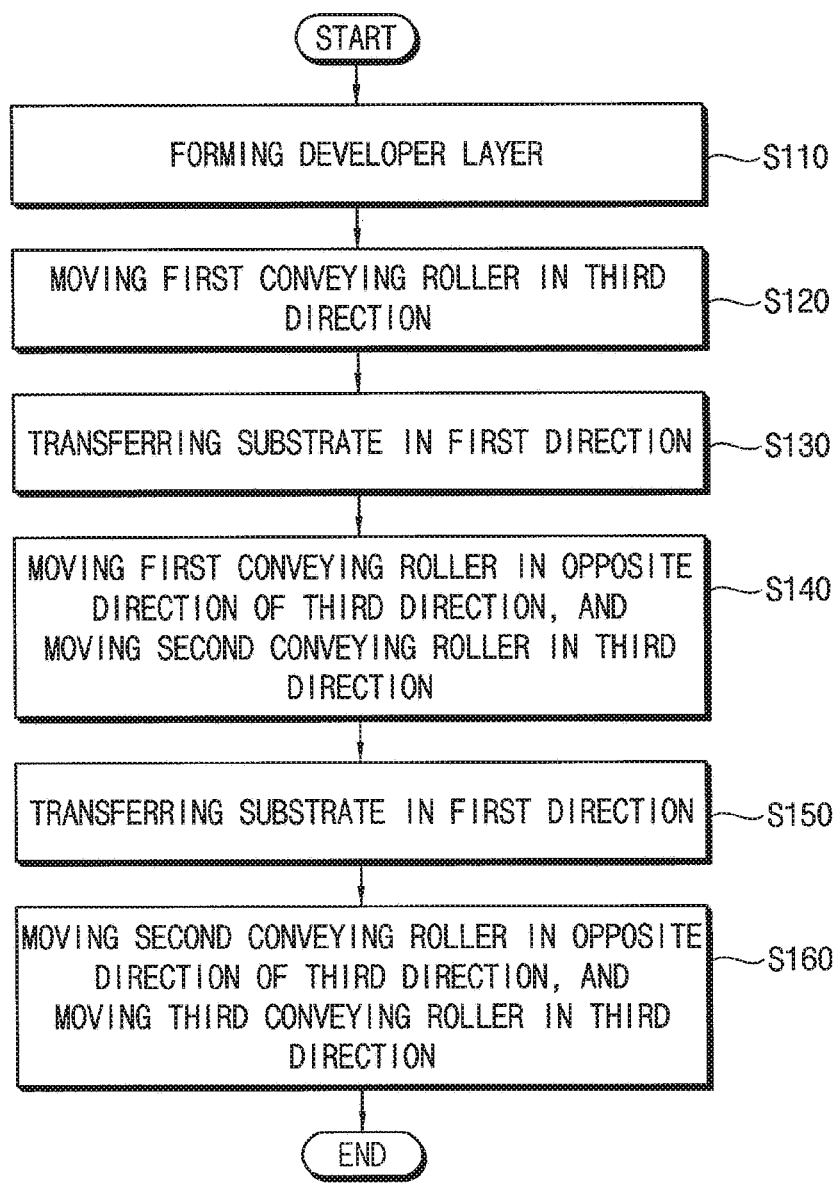

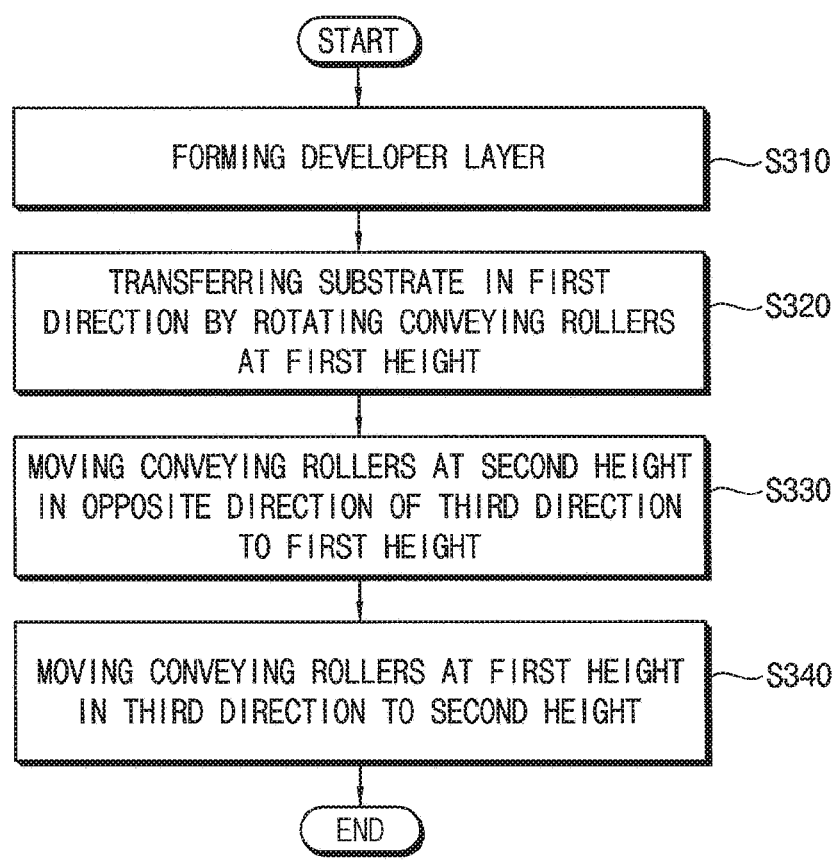

SUBSTRATE TREATING APPARATUS AND METHOD OF TREATING SUBSTRATE

The present application claims priority to and the benefit of Korean Patent Application No. 10-2017-0154326, filed on Nov. 17, 2017, the disclosure of which is incorporated by reference herein in its entirety.

BACKGROUND

1. Field

Example embodiments of the inventive concept relate to a substrate treating apparatus, and a method of treating a substrate. More particularly, example embodiments of the inventive concept relate to a substrate treating apparatus and a method of treating a substrate for a puddle type development.

2. Description of the Related Art

Recently, a display apparatus having light weight and small size has been manufactured. A cathode ray tube (CRT) display apparatus has been used due to a performance and a competitive price. However the CRT display apparatus has a weakness with a size or portability. Therefore a flat panel display such as a plasma display, a liquid crystal display and an organic light emitting display has been highly regarded due to small size, light weight and low-power-consumption.

In a photoresist coating and developing system for manufacturing the display apparatus, as a developing system for a large substrate (for example, a glass substrate), a so-called parallel processing type substrate treating apparatus in which a series of development processing steps such as development, rinsing, and drying is carried out during transfer of the substrate on a transfer line provided with a plurality of conveying rollers in a horizontal direction has been used.

In this case, a puddle method may be used, which is a method in which a developing process is carried out after a developer is supplied onto the substrate to form a developer layer. However, there has been a problem that a developing process is not uniformly performed according to a position of the substrate.

SUMMARY

One or more example embodiment of the inventive concept provides a substrate treating apparatus capable of improving quality of the developing process.

One or more example embodiments of the inventive concept also provide a method of treating a substrate capable of improving quality of the developing process.

According to an example embodiment of the inventive concept, a substrate treating apparatus includes a plurality of conveying rollers arranged in a first direction which is a horizontal direction, and configured to transfer a substrate in the first direction, a developer providing nozzle configured to provide a developer onto the substrate to form a developer layer on the substrate, a sensor part for recognizing a position of the substrate, and a vertical moving part configured to move each of the conveying rollers along a third direction substantially perpendicular to the substrate.

In an example embodiment, the vertical moving part may move the first conveying roller immediately preceding a front end in the third direction so as to be away from the substrate. As the substrate is transferred in the first direction and the front end of the substrate passes the first conveying roller which has been moved in the third direction, the vertical moving part may move the first conveying roller in a direction opposite to the third direction to contact with a lower surface of the substrate.

In an example embodiment, the plurality of conveying rollers may include the first conveying roller, a second conveying roller and a third conveying roller which are sequentially arranged in the first direction. As the substrate is transferred in the first direction, the vertical moving part may move the first conveying roller in the third direction (move) and return the first conveying roller in the direction opposite to the third direction (return), moves and returns the second conveying roller, and moves and return the third conveying roller in order.

In an example embodiment, the vertical moving part may move a fourth conveying roller which is immediately preceding a rear end in the third direction so as to be away from the substrate. As the substrate is transferred in the first direction and the rear end of the substrate passes the fourth conveying roller which has been moved in the third direction, the vertical moving part may move the fourth conveying roller in the direction opposite to the third direction.

In an example embodiment, the plurality of conveying rollers may include a fourth conveying roller, a fifth conveying roller and a sixth conveying roller which are sequentially arranged in the first direction. As the substrate is transferred in the first direction, the vertical moving part may move the fourth conveying roller in the third direction (move) and return the fourth conveying roller in the direction opposite to the third direction (return), move and return the fifth conveying roller, and move and return the sixth conveying roller in order.

In an example embodiment, the sensor part may sense the front end or the rear end of the substrate and calculate a position of the front end or the rear end of the substrate in accordance with transferring of the substrate by using a rotation speed of the conveying rollers and a sensed position of the front end or the rear end of the substrate.

In an example embodiment, a gap between two conveying rollers adjacent to each other may be defined as a conveying roller gap. When the front or rear end of the substrate is located within the conveying roller gap, the two conveying rollers adjacent to each other may be moved in the third direction or the direction opposite to the third direction.

In an example embodiment, moving distance of the front or rear end of the substrate while the two conveying rollers adjacent to each other are moved in the third direction or the direction opposite to the third direction may be defined as a control gap. The control gap may be smaller than the conveying roller gap.

In an example embodiment, the conveying rollers may be located at a first height or at a second height lower than the first height. The conveying rollers which may be positioned at the first height may be in contact with the substrate to transfer the substrate. As the substrate is transferred in the first direction, the conveying roller which may be located at the second height adjacent to the front end of the substrate is moved in the direction opposite to the third direction so as to contact a lower surface of the substrate. The conveying roller which may be located at the first height adjacent to the rear end of the substrate is moved in the third direction so as to be located at the second height.

In an example embodiment, the substrate treating apparatus may further include a rinsing solution providing nozzle to provide rinsing solution for removing the developer layer onto the substrate. The vertical moving part may be configured to move each of the conveying rollers disposed between the developer providing nozzle and the rising solution providing nozzle along the third direction, individually.

According to an example embodiment of the inventive concept, a method of treating a substrate using a substrate treating apparatus including a plurality of conveying rollers which transfer the substrate in a horizontal direction is provided. The method includes forming a developer layer by providing a developer onto the substrate, moving a first conveying roller which is closest to a front end of the substrate in a transferring direction and does not contact the substrate away from the substrate, transferring the substrate on which the developer layer is formed in the horizontal direction by rotating the plurality of conveying rollers, moving the first conveying roller vertically upward to make the first conveying roller contact the lower surface of the substrate, and transferring the substrate in the horizontal direction by rotating the first conveying roller, and the plurality of conveying rollers which contact with the substrate.

In an example embodiment, the method may further include moving a second conveying roller which is adjacent to the first conveying roller in the horizontal direction away from the substrate, transferring the substrate in the horizontal direction by rotating the first conveying roller and the plurality of conveying rollers, moving the second conveying roller vertically upward to make the second conveying roller contact the lower surface of the substrate, and transferring the substrate in the horizontal direction by rotating the first conveying roller, the second conveying roller and the plurality of conveying rollers which contact with the substrate.

In an example embodiment, the method may further include moving a third conveying roller which is adjacent to the second conveying roller in the horizontal direction vertically downward, transferring the substrate in the horizontal direction by rotating the first conveying roller, the second conveying roller and the plurality of conveying rollers, moving the third conveying roller vertically upward to make the third conveying roller contact the lower surface of the substrate, and transferring the substrate in the horizontal direction by rotating the first conveying roller, the second conveying roller, the third conveying roller and the plurality of conveying rollers which contact with the substrate.

In an example embodiment, the step of moving the second conveying roller vertically upward and the step of moving a third conveying roller away from the substrate may be performed at the same time.

In an example embodiment, the method may further include moving a fourth conveying roller which is closest to a rear end of the substrate in the transferring direction and contacts with the substrate away from the substrate, and transferring the substrate in the horizontal direction by rotating a fifth conveying roller which is adjacent to the fourth conveying roller in the horizontal direction and the plurality of conveying rollers.

In an example embodiment, the method may further include moving the fourth conveying roller vertically upward, moving the fifth conveying roller which contacts with the substrate away from the substrate, and transferring the substrate in the horizontal direction by rotating a sixth conveying roller which is adjacent to the fifth conveying roller in the horizontal direction and the plurality of conveying rollers.

In an example embodiment, in the step of the moving the fourth conveying roller vertically upward may be performed after the rear end of the substrate passes the fourth conveying roller, so that the substrate does not make contact with the fourth conveying roller even if the fourth conveying roller is moved vertically upward.

In an example embodiment, the front end and the rear end of the substrate in the transferring direction may be not in direct contact with the conveying rollers while the substrate is being transferred in the horizontal direction, so that the developer layer on the substrate does not flow from a top surface of the substrate to the conveying roller through the front end and the rear end.

In an example embodiment, the substrate treating apparatus may include sensor part. The sensor part may sense the front end or the rear end of the substrate, and calculate a position of the front end or the rear end of the substrate in accordance with transferring of the substrate by using a rotation speed of the conveying rollers and a sensed position of the front end or the rear end of the substrate.

According to an example embodiment of the inventive concept, a method of treating a substrate using a substrate treating apparatus comprising a plurality of conveying rollers which transfer the substrate in a horizontal direction is provided. The method include forming a developer layer by providing a developer onto the substrate on the conveying rollers positioned at a first height and in contact with a lower surface of the substrate, transferring the substrate on which the developer layer is formed in the horizontal direction by rotating the conveying rollers positioned at the first height. As the substrate is transferred, the conveying rollers located at a second height which is lower than the first height and adjacent to a front end of the substrate is moved vertically upward to contact with a lower surface of the substrate. As the substrate is transferred, the conveying rollers located at the first height which is adjacent to a rear end of the substrate is moved away from the substrate and be located at the second height.

According to a substrate treating apparatus and a method of treating a substrate of the present inventive concept, a conveying roller is raised or lowered in a third direction which is a to the substrate, so that front or rear end of the substrate is not in contact with the conveying roller although the front end or the rear end of the substrate slightly bends to downward when the substrate is transferred in the first direction. Accordingly, outflow of developer through the conveying roller can be minimized Therefore, the developing process may be performed uniformly, and the quality of the photoresist pattern after the developing process can be improved.

It is to be understood that both the foregoing general description and the following detailed description are exemplary and explanatory and are intended to provide further explanation of the inventive concept as claimed

BRIEF DESCRIPTION OF THE DRAWINGS

The above and other features of the inventive concept will become more apparent by describing in detail example embodiments thereof with reference to the accompanying drawings, in which:

FIGS. 1A, 1B, 1C and 1D are cross-sectional views of a substrate treating apparatus to explain a method of treating a substrate according to an example embodiment of the inventive concept;

FIG. 7 is a flowchart illustrating a method of treating a substrate according to an example embodiment of the inventive concept;

FIG. 9 is a flowchart illustrating a method of treating a substrate according to an example embodiment of the inventive concept.

DETAILED DESCRIPTION

Hereinafter, the inventive concept will be explained in detail with reference to the accompanying drawings.

FIGS. 1A, 1B, 1C and 1D are cross-sectional views of a substrate treating apparatus to explain a method of treating a substrate according to an example embodiment of the inventive concept.

Figure 1C:
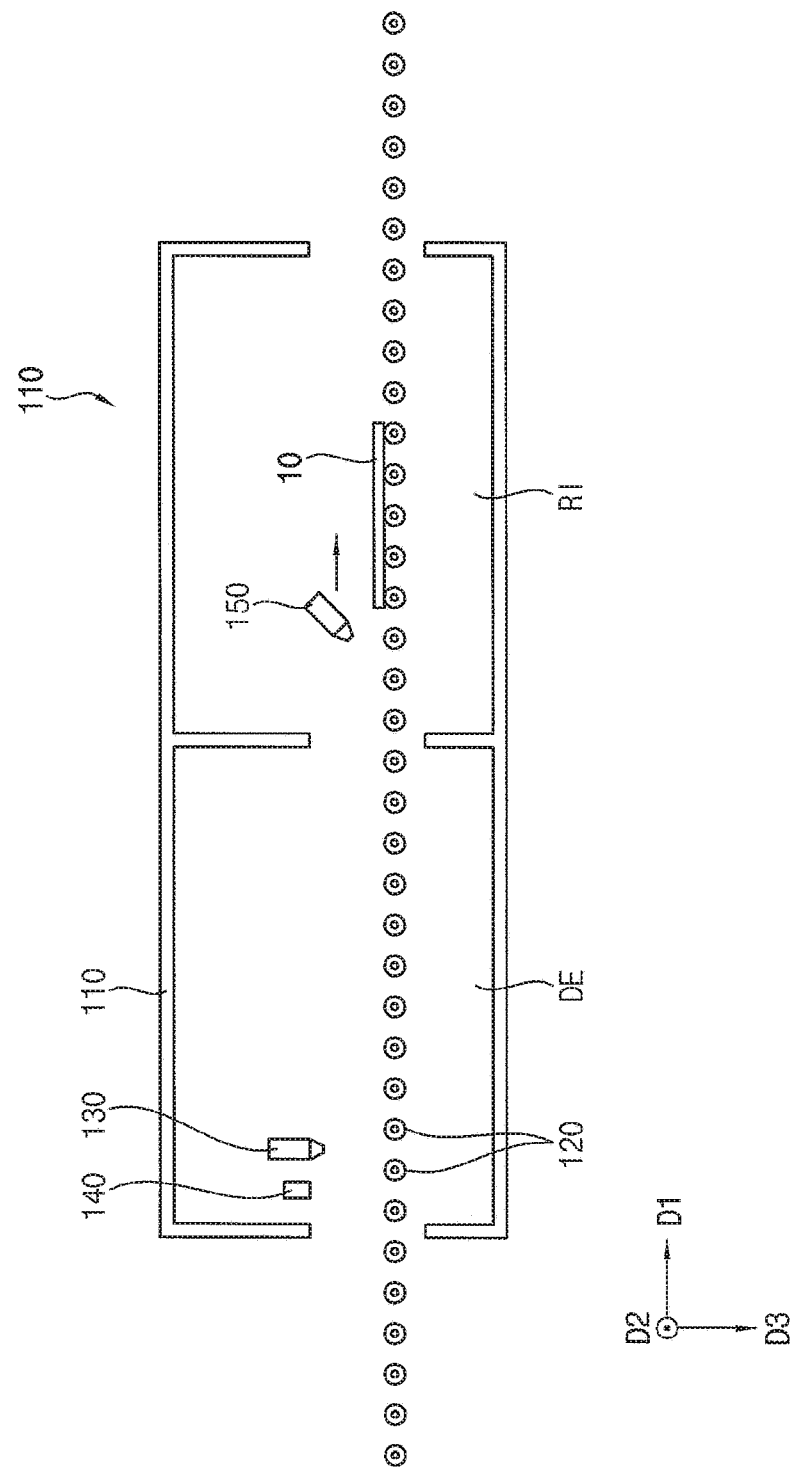
Figure 2A:
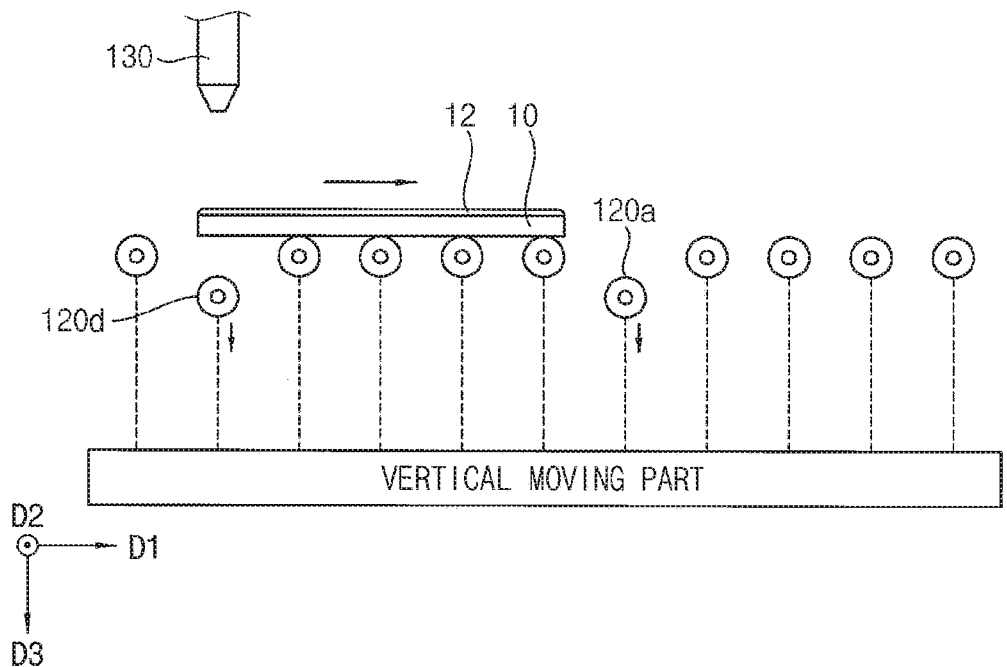
FIGS. 2A, 2B, and 2C are side cross-sectional views of a portion of the substrate treating apparatus to explain transferring of a substrate to be processed in the method of FIGS. 1A to 1D.

Referring to FIGS. 1A to 1D, the substrate treating apparatus 100 may include a housing 110 which includes a developing part DE and a rinsing part RI, a plurality of conveying rollers 120, a developer providing nozzle 130, a sensor part 140, a rinsing solution providing nozzle 150 and a vertical moving part (refers to FIG. 2A).

The housing 110 may form the developing part DE in which development process of a photoresist on a substrate 10 is performed, and the rinsing part RI in which the substrate 10 is cleaned.

The plurality of the conveying rollers 120 may be arranged in a first direction D1 which is a horizontal direction. Each of the conveying rollers 120 may rotate to transfer the substrate 10 which is disposed on the conveying rollers 120 to the first direction D1 toward the developing part DE and the rinsing part RI. Thus, the plurality of conveying rollers 120 may form a transfer line for transferring the substrate 10 in the first direction D1. The transfer line may pass through the developing part DE and the rinsing part RI.

Each of the conveying rollers 120 may have a configuration in which a plurality of rollers is installed on a cylindrical shaft extending in the second direction D2. (refers to FIG. 4).

The developer providing nozzle 130 may be disposed in the developing part DE of the housing 110, and may provide developer onto the substrate 10. The developer may be provided on the substrate 10 to form a developer layer 12.

The sensor part 140 may detect a position of the substrate 10. For example, the sensor part 140 may sense a leading edge or a trailing edge of the substrate 10, and calculate the position of a front end or a rear end of the substrate which is changed according to the transfer of the substrate 10 by using a rotation speed of the conveying roller based on the sensed front end or rear end of the substrate 10. Accordingly, if the sensor part 140 senses the front end or rear end of the substrate 10 at one position only, the position of the front end or the rear end of the substrate 10 can be known while the substrate 10 is transferred along the transfer line by the conveying rollers 120.

The rinsing solution providing nozzle 150 may be disposed in the rinsing part RI. The rinsing solution providing nozzle 150 may clean the substrate 10 by removing the developer layer 12 on the substrate 10 after the development process.

The vertical moving part (refers to FIG. 2A) may move each of the conveying rollers 120 along a third direction D3 which is perpendicular to the first and second directions D1 and D2. The vertical moving part may be any structure as long as it can move the conveying rollers 120 individually. For example, it may be a lifting apparatus connected to both ends of each conveying roller 120. The third direction D3 may be downward direction. That is, each of the conveying rollers 120 may be individually moved up and down with respect to the ground.

Referring again to FIG. 1A, the substrate 10 may be loaded onto the substrate treating apparatus. The sensor part 140 may detect the position of the substrate 10. As the conveying rollers 120 rotate, the substrate 10 may be transferred in the first direction D1.

Referring again to FIG. 1B, as the substrate 10 proceeds to the developing part DE, the developer providing nozzle 130 may provide the developer on the substrate 10 to form the developer layer 12.

At this time, in order to prevent the developer of the developer layer 12 from flowing out through the front end and the rear end of the substrate 10, the conveying roller 120 may be moved in the third direction D3 and a direction opposite to the third direction D3.

Referring again to FIG. 1C, a development process by the developer layer 12 may be completed while the substrate 10 passes through the developing part DE to the rinsing part RI. The rinsing solution may be provided on the substrate 10 which is transferred to the rinsing part RI by the rinsing solution providing nozzle 150 to remove the developer layer 12.

Referring again to FIG. 1D, the substrate 10 may be unloaded from the substrate treating apparatus 100 and the substrate 10 may be dried. Thus, the developing process may be completed.

A method of treating a substrate using the substrate treating apparatus can be generally used for manufacturing a display apparatus or the like. The display apparatus may be formed by an array process for forming a gate line, a data line, a thin film transistor and the like on a transparent substrate such as glass, a cell process for forming the liquid crystal layer, and a module process for joining a display panel and a driving unit.

Here, the array process may include a photolithography process and an etching process. The photolithography process may include a coating process for applying a pattern forming material, for example, a photoresist (PR), with a predetermined thickness, an exposure process for aligning a glass substrate coated with the photoresist and a mask at which a desired pattern is formed, and irradiating a light source on the mask for photosensitization of PR, and a develop process to selectively dissolve unnecessary portions of the PR using developer. In the etching process, a pattern forming material may be etched in a pattern of the photoresist which is formed on the transparent substrate.

In the developing process, the patterned photoresist may not uniformly developed because of a difference in turbidity of the developer due to a difference in density of the pattern, a difference in the flowability of the developer due to the transferring direction of the transparent substrate and a liquid dropping of the developer. This leads to an increase in the critical dimension (CD).

According to the embodiments, the problem that the developer on the substrate flows out through the conveying roller while being in contact with the conveying roller of the substrate treating apparatus may be solved, so that the patterned photoresist may be uniformly developed, and the critical dimension (CD) may be maintained as desired. Thus, the quality of the developing process may be improved. In addition, when the substrate treating apparatus and the method of treating a substrate are used for manufacturing the display apparatus, the quality of the display apparatus may be improved.

Figure 2B:
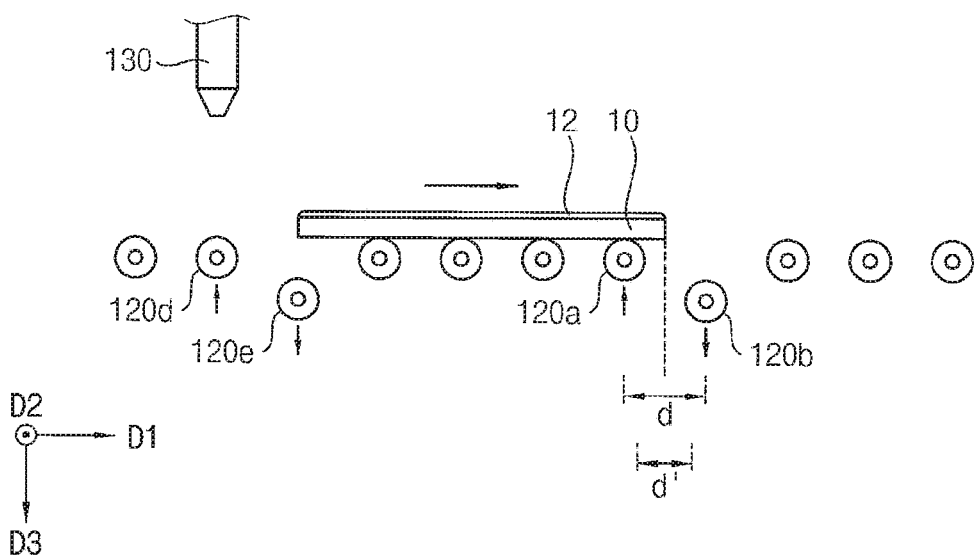
Figure 2C:
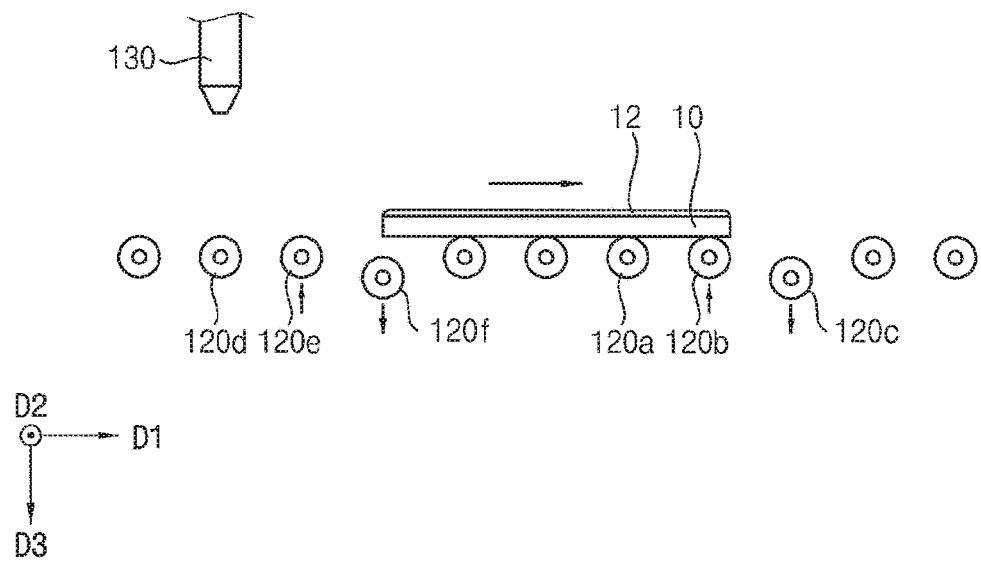

FIGS. 2A, 2B, and 2C are side cross-sectional views of a portion of the substrate treating apparatus to explain transferring of a substrate to be processed in the method of FIGS. 1A to 1D.

Referring to FIGS. 2A to 2D, the substrate treating apparatus may include a first conveying roller 120a, a second conveying roller 120b and a third conveying roller 120c which are sequentially disposed in a first direction D1. The substrate treating apparatus may further include a fourth conveying roller 120d, a fifth conveying roller 120e, and sixth conveying roller 120f sequentially disposed in the first direction D1.

Referring again to FIG. 2A, as the substrate 10 is transferred by conveying rollers, a developer providing nozzle 130 may provide a developer on the substrate 10 to form a developer layer 12 on the substrate.

After forming the developer layer 12, while the substrate 10 is being transferred in the first direction D1, the developer layer 12 in front and rear ends of the substrate 10 in a transferring direction may move in a vertical downward direction (third direction D3) or an upward direction (opposite direction of the third direction D3) so as not to directly contact the substrate. Especially, the first conveying roller 120a may be a conveying roller that is adjacent to the front end of the substrate 10 in the first direction D1 and does not contact the substrate 10. The first conveying roller 120a immediately preceding the front end of the substrate 10 may be moved in the third direction D3 so that a distance from the substrate 10 to first conveying roller 120a may be increased.

In addition, the fourth conveying roller 120d which is adjacent to the rear end of the substrate 10 in the first direction D1 and in contact with the substrate 10, that is, the fourth conveying roller 120d immediately preceding the rear end, may be moved in the third direction D3 so as to be away from the substrate 10.

Referring again to FIG. 2B, as the substrate 10 is transferred in the first direction D1 and the front end of the substrate 10 passes the first conveying roller 120a which has been moved in the third direction D3, the first conveying roller 120a may be moved in the direction opposite to the third direction D3 to contact with the lower surface of the substrate 10.

The second conveying roller 120b immediately preceding the front end of the substrate 10 may be moved in the third direction D3 to increase a distance from the substrate 10 to the second conveying roller 120b.

In addition, as the substrate is transferred in the first direction D1, the rear end of the substrate 10 passes the fourth conveying roller 120d which has been moved in the third direction D3, the fourth conveying roller 120d may be moved in the direction opposite to the third direction D3 to return the fourth conveying roller 120d to the original position.

The fifth conveying roller 120e adjacent to the rear end of the substrate 10 and contacting the substrate 10, that is, the fifth conveying roller 120e immediately following the rear end of the substrate 10, may be moved in the third direction D3 so that fifth conveying roller 120e may be separated from the substrate 10.

Here, a gap between the first conveying roller 120a and the second conveying roller 120b in the first direction D1 may be defined as a conveying roller gap d. Movement of the first conveying roller 120a and the second conveying roller 120b in the vertical direction may be performed when the front end of the substrate 10 is positioned between the conveying roller gap d. For design margins, it is preferable that the first conveying roller 120a and the second conveying roller 120b move in the vertical direction when the front end of the substrate 10 is located within a control gap d' that is less than the conveying roller gap d.

Similarly, at the rear end of the substrate 10, a vertical movement of the fourth conveying roller 120d and the fifth conveying roller 120e may be performed when the the rear end of the substrate 10 is positioned between the conveying roller gap.

Referring again to FIG. 2C, as the substrate 10 is transferred in the first direction D1 and the front end of the substrate 10 passes the second conveying roller 120b which has been moved in the third direction D3, the second roller 120b may be moved in the direction opposite to the third direction D3 to contact with the lower surface of the substrate 10.

The third conveying roller 120c immediately preceding the front end of the substrate 10 may be moved in the third direction D3 to increase a distance from the substrate 10 to the third conveying roller 120c.

In addition, as the substrate is transferred in the first direction D1, the rear end of the substrate 10 passes the fifth conveying roller 120e which has been moved in the third direction D3, the fifth conveying roller 120e may be moved in the direction opposite to the third direction D3 to return the fifth conveying roller 120d to the original position.

The sixth conveying roller 120f adjacent to the rear end of the substrate 10 and contacting the substrate 10, that is, the sixth conveying roller 120f immediately preceding the rear end of the substrate 10, may be moved in the third direction D3 so that sixth conveying roller 120f may be separated from the substrate 10.

Figure 3A:
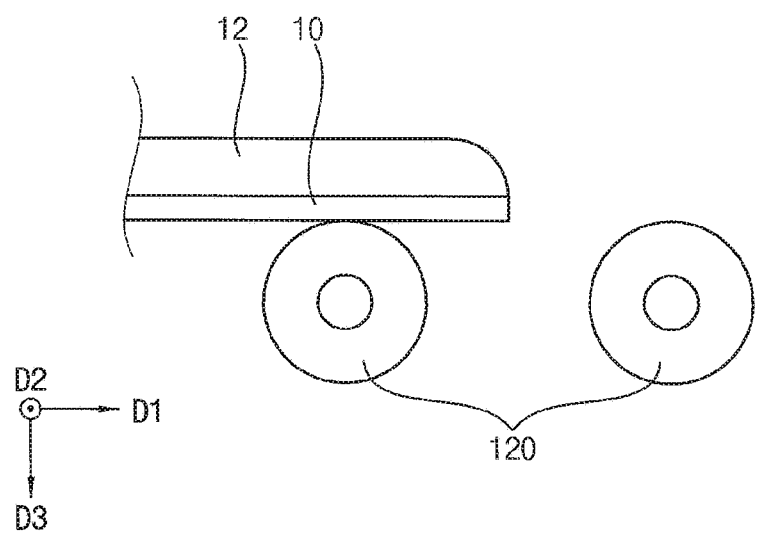
FIGS. 3A and 3B are enlarged cross-sectional views illustrating a phenomenon in which an uneven development process occurs during transferring of a substrate by a conventional method.
Figure 3B:
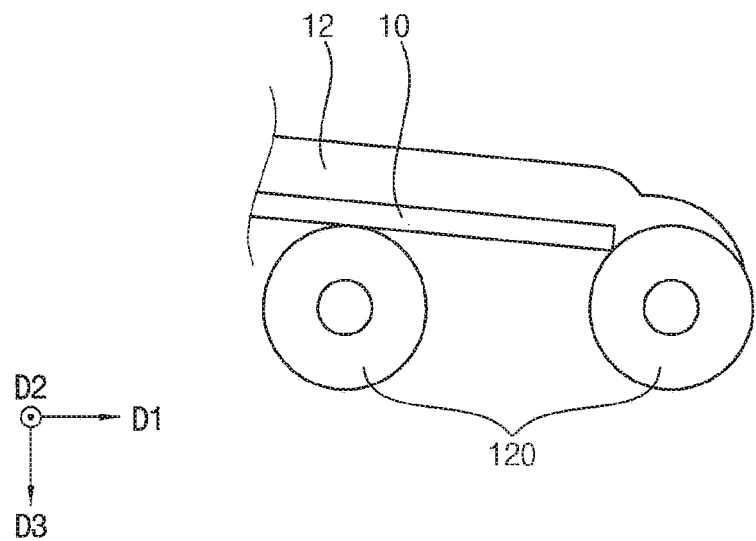

FIGS. 3A and 3B are enlarged cross-sectional views illustrating a phenomenon in which an uneven development process occurs during transferring of a substrate by a conventional method.

Referring to FIGS. 3A and 3B, according to a conventional substrate treating apparatus, as the substrate 10 on which the developer layer 12 is formed is transferred, the front end of the substrate 10 makes contact with the conveying roller 120. Here, the front end of the substrate 10 is slightly bent in a direction of gravity, and developer of the developer layer 12 on the substrate 10 may be contacted with the conveying roller 120 and may be discharged from a top surface of the substrate 10.

Accordingly, the developer on the substrate 10 may flow from the top surface of the substrate 10 to the conveying roller 120, thus, degree of development by the developer may become not uniform according to flow of the developer.

Thus, the critical dimension (CD) of the patterned photoresist may be increased. Accordingly, a photoresist pattern after the development process is not uniform depending on the position, so that the quality of the photoresist pattern may be deteriorated.

Figure 4:
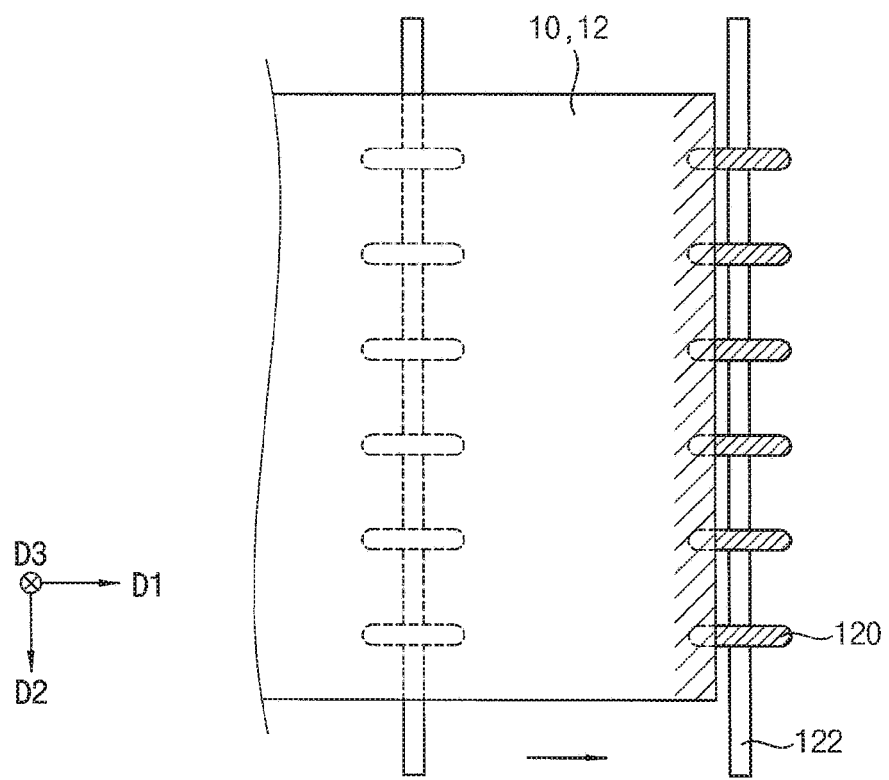
FIG. 4 is a plan view showing a portion of the substrate of FIGS. 3A and 3B.

FIG. 4 is a plan view showing a portion of the substrate of FIGS. 3A and 3B.

Referring to FIG. 4, a conveying roller 120 is installed at a cylindrical shaft 122 extending in a second direction D2. It can be confirmed that a developer of a developer layer 12 may flow from the top surface of the substrate 10 to the conveying roller 120 in a portion where the conveying roller 120 and a substrate 10 are in contact with each other.

Figure 5A:
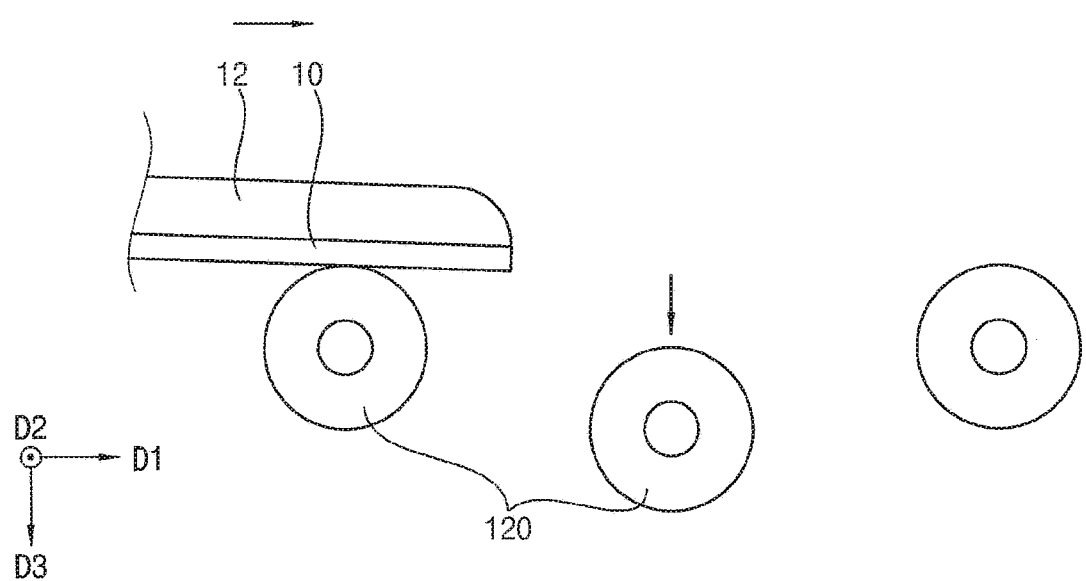
FIGS. 5A and 5B are enlarged cross-sectional views showing a portion of a substrate to be processed and a substrate treating apparatus to explain effect of the method of FIGS. 2A to 2C.
Figure 5B:
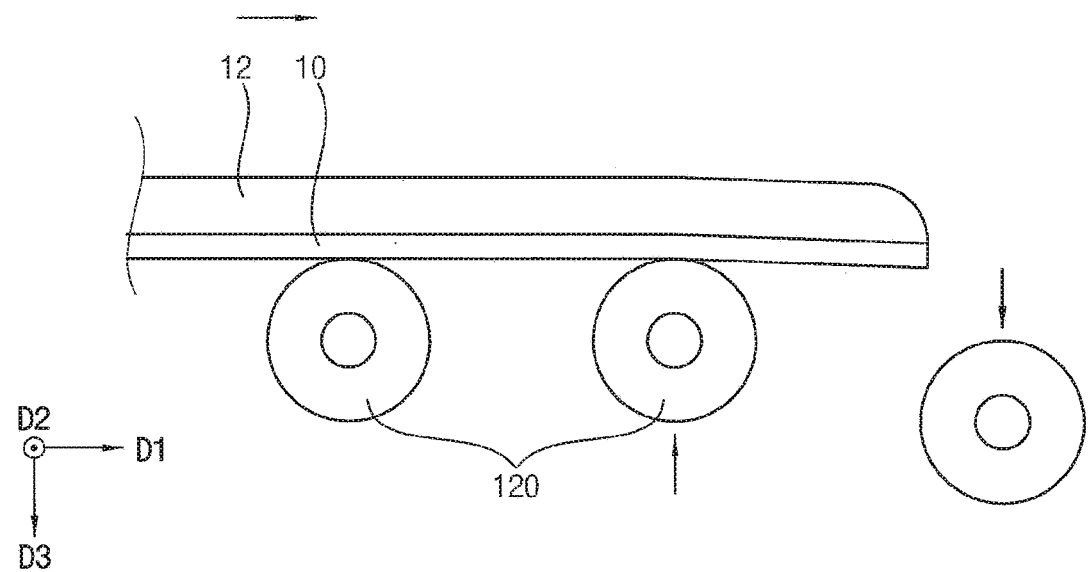

FIGS. 5A and 5B are enlarged cross-sectional views showing a portion of a substrate to be processed and a substrate treating apparatus to explain effect of the method of FIGS. 2A to 2C.

According to the embodiment of the present inventive concept, unlike the prior art, the conveying roller 120 of the substrate treating apparatus is raised or lowered in the third direction D3 which is the vertical direction, so that the front or rear end of the substrate 10 is not in contact with the conveying roller 120 although the front end or the rear end of the substrate 10 slightly bends to downward when the substrate 10 is transferred in the first direction D1. Accordingly, outflow of developer through the conveying roller 120 can be minimized Therefore, the developing process may be performed uniformly, and the quality of the photoresist pattern after the developing process can be improved.

Figure 6A:
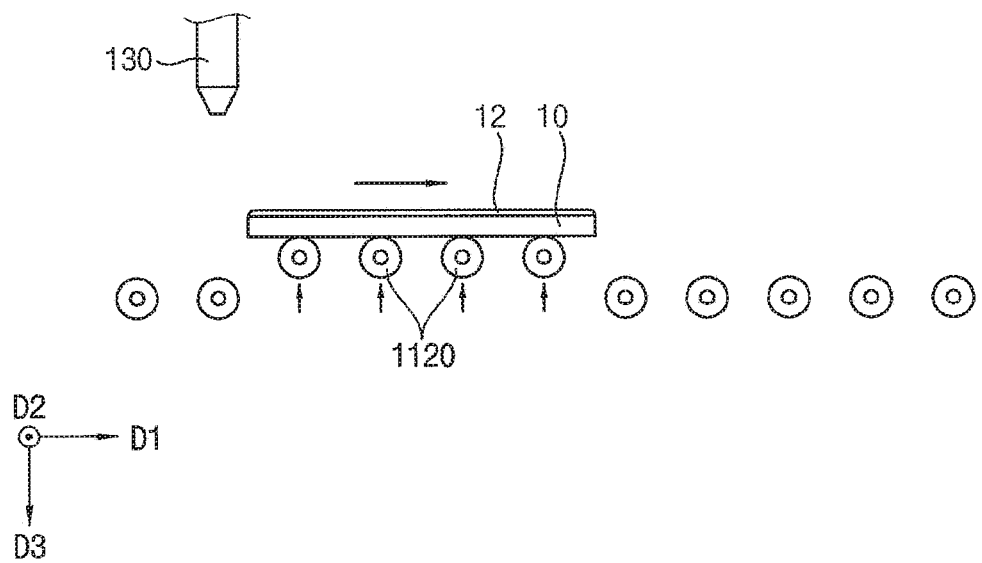
FIGS. 6A, 6B, and 6C are side cross-sectional views of a portion of a substrate treating apparatus to explain transferring of a substrate to be processed in a method of treating the substrate according to an embodiment of the present inventive concept.
Figure 6B:
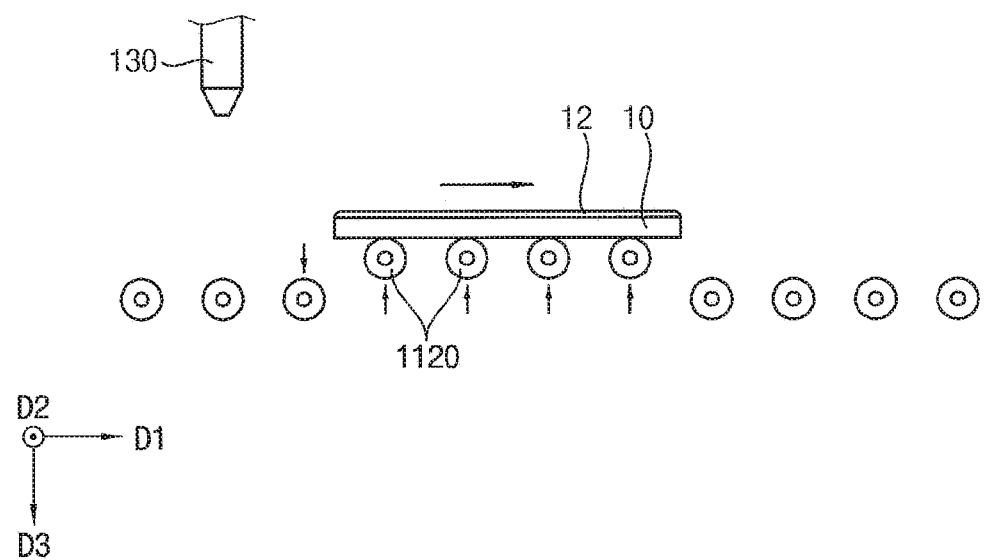
Figure 6C:
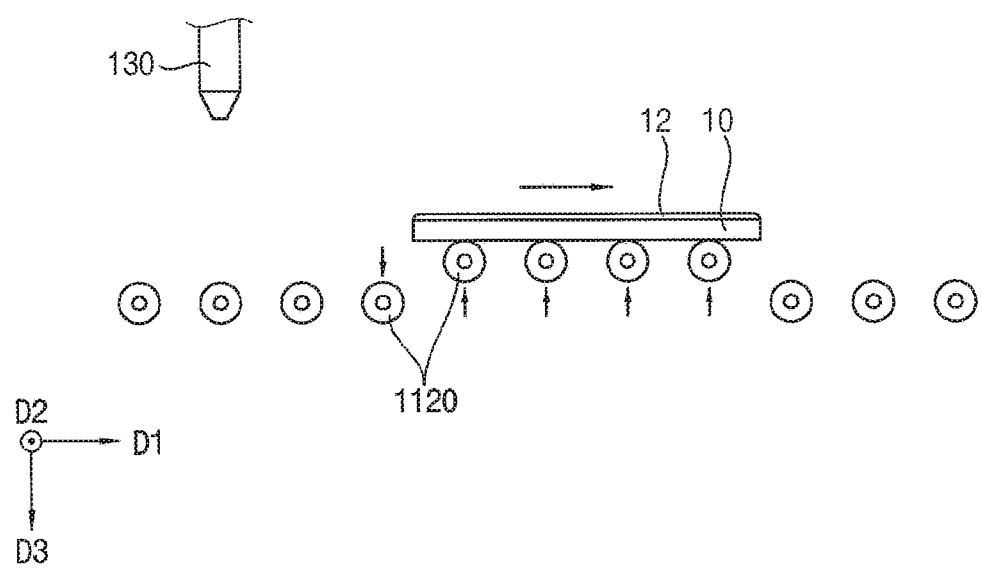

FIGS. 6A, 6B, and 6C are side cross-sectional views of a portion of a substrate treating apparatus to explain transferring of a substrate to be processed in a method of treating the substrate according to an embodiment of the present inventive concept. The substrate treating method is similar to the method described in FIGS. 2A to 2C except that transfer rollers 1120 which are not in contact with the substrate 10 are disposed lower height than the transfer rollers 1120 which are in contact with the substrate 10.

Referring to FIGS. 6A to 6C, the substrate treating apparatus may include a plurality of conveying rollers 1120 and a developer providing nozzle 130.

The conveying rollers 1120 may be arranged in a first direction D1 which is a horizontal direction. Each of the conveying rollers 1120 may rotate to transfer the substrate 10 which is disposed on the conveying rollers 1120 in the first direction D1. Thus, the plurality of conveying rollers 1120 may form a transfer line for transferring the substrate 10 in the first direction D1.

The developer providing nozzle 130 may provide a developer on the substrate 10. The developer may form a developer layer 12 on the substrate 10.

The substrate treating apparatus may be substantially the same as the substrate treating apparatus described with reference to FIGS. 1A to 1, except for a control of conveying rollers 1120 of the substrate treating apparatus.

The conveying rollers 1120 may be located at a first height or at a second height lower than the first height. The conveying rollers 1120 positioned at the first height may contact the substrate 10 to transfer the substrate 10.

As the substrate 10 is transferred in the first direction D1, the conveying rollers 1120 located at the second height adjacent to a front end of the substrate 10 may be moved in a direction opposite to a third direction D3, that is, in the vertical direction so as to contact the lower surface of the substrate 10. Then, the conveying rollers 1120 moved are located at the first height.

At this time, the conveying roller 1120 positioned at the first height adjacent to a rear end of the substrate 10 may be moved in the third direction D3 to be positioned at the second height.

By repeating this process, the conveying rollers 1120 are brought into contact with the lower surface of the substrate 10 while being disposed at the position of the first height higher than the second height, so that the substrate 10 is transferred. And, as the substrate 10 is transported in the first direction D1, the conveying rollers 1120 adjacent to the rear end of the substrate 10 are moved vertically downward again to return to the second height.

FIG. 7 is a flowchart illustrating a method of treating a substrate according to an example embodiment of the inventive concept. Hereinafter, the method of treating a substrate in a region adjacent to a front end of the substrate will be described.

Referring to FIG. 7, the method may include a step of forming developer layer (S110), a step of moving first conveying roller in third direction (S120), a step of transferring substrate in first direction (S130), a step of moving first conveying roller in opposite direction of third direction, and moving second conveying roller in third direction (S140), a step of transferring substrate in first direction (S150), and moving second conveying roller in opposite direction of third direction, and moving third conveying roller in third direction (S160). The method may be performed using a substrate treating apparatus including a plurality of conveying rollers for horizontally transferring a substrate. The conveying rollers may include a first conveying roller, a second conveying roller, and a third conveying roller which are arranged in order along the direction in which the substrate is transferred.

In the step of forming developer layer (S110), a developer may be provided onto the substrate to form a developer layer on the substrate.

In the step of moving first conveying roller in third direction (S120), a first conveying roller which is closest to a front end of the substrate in a transferring direction and does not contact the substrate may be moved vertically downward to be further away from the substrate.

In the step of transferring substrate in first direction (S130), the substrate on which the developer layer is formed may be transferred in the horizontal direction by rotating the plurality of conveying rollers which makes contact with the substrate. Accordingly, the front end of the substrate may pass the first conveying roller.

In the step of moving first conveying roller in opposite direction of third direction, and moving second conveying roller in third direction (S140), the first transfer roller may be moved vertically upward so as to be in contact with the lower surface of the substrate. A second conveying roller which is adjacent to the first conveying roller in the horizontal direction may be moved vertically downward to be further separated from the substrate.

In the step of transferring substrate in first direction (S150), the substrate may be transferred in the horizontal direction by rotating the first conveying roller and the plurality of conveying rollers which contact with the substrate.

In the step of moving second conveying roller in opposite direction of third direction, and moving third conveying roller in third direction (S160), the second conveying roller may be moved vertically upward to make contact with the lower surface of the substrate. A third conveying roller which is adjacent to the second conveying roller in the horizontal direction may be moved vertically downward to be further separated from the substrate. (refers to FIGS. 2A to 2C)

Figure 8:
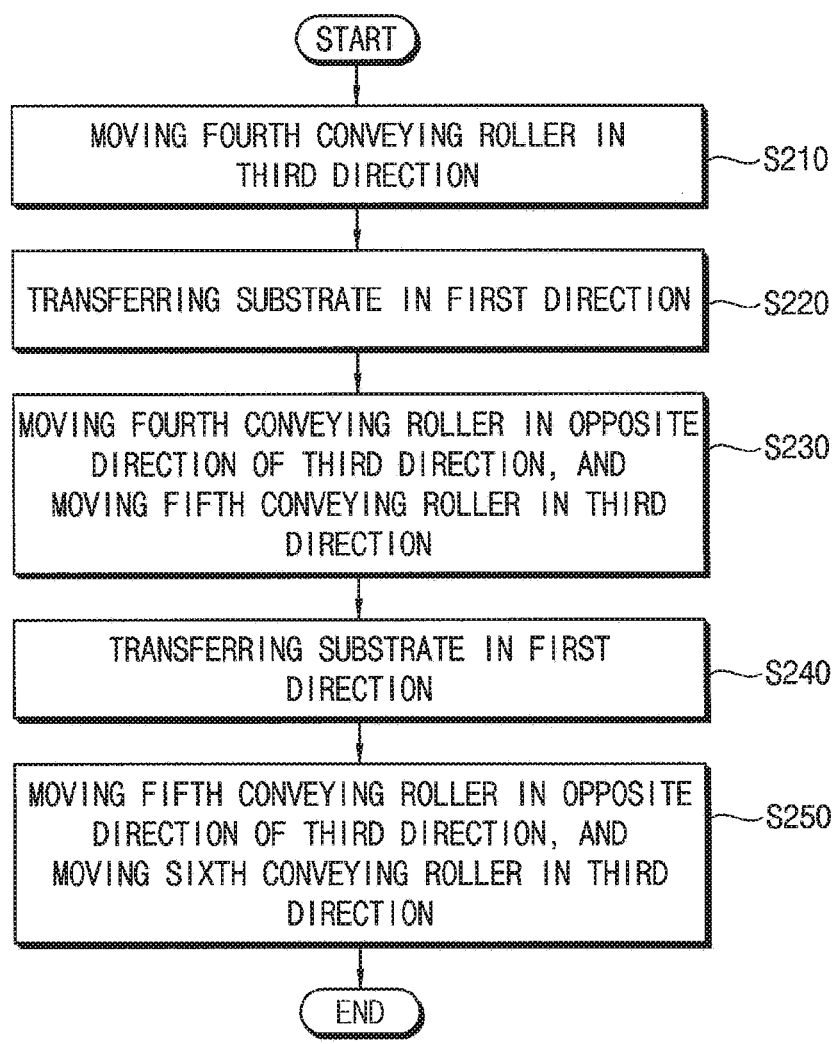
FIG. 8 is a flowchart illustrating a method of treating a substrate according to an example embodiment of the inventive concept.

FIG. 8 is a flowchart illustrating a method of treating a substrate according to an example embodiment of the inventive concept. Hereinafter, the method in a region adjacent to the rear end of the substrate will be described.

Referring to FIG. 8, the method may include moving fourth conveying roller in third direction (S210), transferring substrate in first direction (S220), moving fourth conveying roller in opposite direction of third direction, and moving fifth conveying roller in third direction (S230), transferring substrate in first direction (S240), and moving fifth conveying roller in opposite direction of third direction, and moving sixth conveying roller in third direction (S250). The method may be performed using a substrate treating apparatus including a plurality of conveying rollers which transfer the substrate in a horizontal direction. The conveying rollers may include a fourth conveying roller, a fifth conveying roller and a sixth conveying roller which are disposed in order along a transferring direction of the substrate.

In the step of moving fourth conveying roller in third direction (S210), a fourth conveying roller which is adjacent to the rear end the substrate in the first direction and in contact with the substrate may be moved vertically downward to be separated from the substrate.

In the step of transferring substrate in first direction (S220), the substrate may be transferred in the horizontal direction by rotating a fifth conveying roller which is adjacent to the fourth conveying roller in the horizontal direction and the plurality of conveying rollers.

In the step of moving fourth conveying roller in opposite direction of third direction, and moving fifth conveying roller in third direction (S230), the fourth conveying roller may be moved vertically upward. The fifth conveying roller which contacts with the substrate may be moved vertically downward to be separated from the substrate.

In the step of transferring substrate in first direction (S240), the substrate may be transferred in the horizontal direction by rotating a sixth conveying roller which is adjacent to the fifth conveying roller in the horizontal direction and the plurality of conveying rollers.

In the step of moving fifth conveying roller in opposite direction of third direction, and moving sixth conveying roller in third direction (S250), the fifth conveying roller may be moved vertically upward. The sixth conveying roller which makes contact with the substrate may be moved vertically downward to be separated from the substrate. (refers to FIGS. 2A to 2C)

FIG. 9 is a flowchart illustrating a method of treating a substrate according to an example embodiment of the inventive concept.

Referring to FIG. 9, the method may include forming developer layer (S310), transferring substrate in first direction by rotating conveying rollers at first height (S320), moving conveying rollers at second height in opposite direction of third direction to first height (S330), and moving conveying rollers at first height in third direction to second height (S340). The method may be performed using a substrate treating apparatus including a plurality of conveying rollers for horizontally transferring a substrate.

In the step of forming developer layer (S310), a developer layer may be formed by providing a developer onto the substrate on the conveying rollers positioned at a first height in contact with a lower surface of the substrate.

In the step of transferring substrate in first direction by rotating conveying rollers at first height (S320), the substrate on which the developer layer is formed may be transferred in the horizontal direction by rotating the conveying rollers positioned at the first height.

In the step of moving conveying rollers at second height in opposite direction of third direction to first height (S330), as the substrate is transferred, the conveying rollers located at a second height which is lower than the first height and adjacent to a front end of the substrate is moved vertically upward to contact with a lower surface of the substrate.

In the step of moving conveying rollers at first height to second height (S340), as the substrate is transferred, the conveying rollers located at the first height which is adjacent to a rear end of the substrate is moved vertically downward to be separated from the substrate and be located at the second height. (Refers to FIGS. 6A to 6C)

According to a substrate treating apparatus and a method of treating a substrate of the present inventive concept, a conveying roller is raised or lowered in a third direction which is a vertical direction, so that front or rear end of the substrate is not in contact with the conveying roller although the front end or the rear end of the substrate slightly bends to downward when the substrate is transferred in the first direction. Accordingly, outflow of developer through the conveying roller can be minimized Therefore, the developing process may be performed uniformly, and the quality of the photoresist pattern after the developing process can be improved.

The foregoing is illustrative of the inventive concept and is not to be construed as limiting thereof. Although a few example embodiments of the inventive concept have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific example embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A substrate treating apparatus, comprising:
 a plurality of conveying rollers arranged in a first direction which is a horizontal direction, and configured to transfer a substrate in the first direction;
 a developer providing nozzle configured to provide a developer onto the substrate to form a developer layer on the substrate;
 a sensor part for recognizing a position of the substrate; and
 a vertical moving part configured to move each of the conveying rollers away from the substrate along a second direction substantially perpendicular to the substrate.

2. The substrate treating apparatus of claim 1, wherein the vertical moving part moves a first conveying roller immediately preceding a front end of the substrate in the second direction so as to be away from the substrate, and as the substrate is transferred in the first direction and the front end of the substrate passes the first conveying roller which has been moved in the second direction, the vertical moving part moves the first conveying roller in a direction opposite to the second direction to contact with a lower surface of the substrate.

3. The substrate treating apparatus of claim 2, wherein the plurality of conveying rollers comprises the first conveying roller, a second conveying roller and a third conveying roller which are sequentially arranged in the first direction, and wherein as the substrate is transferred in the first direction, the vertical moving part moves the first conveying roller in the second direction (move) and returns the first conveying roller in the direction opposite to the second direction (return), moves and returns the second conveying roller, and moves and return the third conveying roller in order.

4. The substrate treating apparatus of claim 1, wherein the vertical moving part moves a fourth conveying roller which is immediately preceding a rear end of the substrate in the second direction so as to be away from the substrate, and as the substrate is transferred in the first direction and the rear end of the substrate passes the fourth conveying roller which has been moved in the second direction, the vertical moving part moves the fourth conveying roller in the direction opposite to the second direction.

5. The substrate treating apparatus of claim 4, wherein the plurality of conveying rollers comprises the fourth conveying roller, a fifth conveying roller and a sixth conveying roller which are sequentially arranged in the first direction, and wherein as the substrate is transferred in the first direction, the vertical moving part moves the fourth conveying roller in the second direction (move) and returns the fourth conveying roller in the direction opposite to the second direction (return), moves and returns the fifth conveying roller, and moves and return the sixth conveying roller in order.

6. The substrate treating apparatus of claim 1, wherein the sensor part senses the front end or the rear end of the substrate, and calculates a position of the front end or the rear end of the substrate in accordance with transferring of the substrate by using a rotation speed of the conveying rollers and a sensed position of the front end or the rear end of the substrate.

7. The substrate treating apparatus of claim 1, wherein a gap between two conveying rollers adjacent to each other is defined as a conveying roller gap, when the front or rear end of the substrate is located within the conveying roller gap, the two conveying rollers adjacent to each other are moved in the second direction or the direction opposite to the second direction.

8. The substrate treating apparatus of claim 7, wherein a moving distance of the front or rear end of the substrate while the two conveying rollers adjacent to each other are moved in the second direction or the direction opposite to the second direction is defined as a control gap, and the control gap is smaller than the conveying roller gap.

9. The substrate treating apparatus of claim 1, wherein the conveying rollers are located at a first height or at a second height lower than the first height, the conveying rollers which is positioned at the first height are in contact with the substrate to transfer the substrate, as the substrate is transferred in the first direction, the conveying roller which is located at the second height adjacent to the front end of the substrate is moved in the direction opposite to the second direction so as to contact a lower surface of the substrate, and the conveying roller which is located at the first height adjacent to the rear end of the substrate is moved in the second direction so as to be located at the second height.

10. The substrate treating apparatus of claim 1, further comprising:

a rinsing solution providing nozzle to provide rinsing solution for removing the developer layer onto the substrate, wherein the vertical moving part is configured to move each of the conveying rollers disposed between the developer providing nozzle and the rinsing solution providing nozzle along the second direction, individually.

11. A method of treating a substrate using a substrate treating apparatus comprising a plurality of conveying rollers which transfer the substrate in a horizontal direction, the method comprising:

forming a developer layer by providing a developer onto the substrate;

moving a first conveying roller which is closest to a front end of the substrate in a transferring direction and does not contact the substrate away from the substrate;

transferring the substrate on which the developer layer is formed in the horizontal direction by rotating the plurality of conveying rollers;

moving the first conveying roller vertically upward to make the first conveying roller contact the lower surface of the substrate; and transferring the substrate in the horizontal direction by rotating the first conveying roller and a plurality of conveying rollers which contact with the substrate.

12. The method of claim 11, further comprising:

moving a second conveying roller which is adjacent to the first conveying roller in the horizontal direction away from the substrate;

transferring the substrate in the horizontal direction by rotating the first conveying roller and the plurality of conveying rollers;

moving the second conveying roller vertically upward to make the second conveying roller contact the lower surface of the substrate; and transferring the substrate in the horizontal direction by rotating the first conveying roller, the second conveying roller and the plurality of conveying rollers which contact with the substrate.

13. The method of claim 12, further comprising:

moving a third conveying roller which is adjacent to the second conveying roller in the horizontal direction away from the substrate;

transferring the substrate in the horizontal direction by rotating the first conveying roller, the second conveying roller and the plurality of conveying rollers;

moving the third conveying roller vertically upward to make the third conveying roller contact the lower surface of the substrate; and transferring the substrate in the horizontal direction by rotating the first conveying roller, the second conveying roller, the third conveying roller and the plurality of conveying rollers which contact with the substrate.

14. The method of claim 12, wherein the step of moving the second conveying roller vertically upward and the step of moving a third conveying roller away from the substrate are performed at the same time.

15. The method of claim 12, further comprising:
moving a fourth conveying roller which is closest to a rear end of the substrate in the transferring direction and contacts with the substrate away from the substrate; and
transferring the substrate in the horizontal direction by rotating a fifth conveying roller which is adjacent to the fourth conveying roller in the horizontal direction and the plurality of conveying rollers.

16. The method of claim 15, further comprising:
moving the fourth conveying roller vertically upward;
moving the fifth conveying roller which contacts with the substrate away from the substrate; and
transferring the substrate in the horizontal direction by rotating a sixth conveying roller which is adjacent to the fifth conveying roller in the horizontal direction and the plurality of conveying rollers.

17. The method of claim 16, wherein in the step of the moving the fourth conveying roller vertically upward is performed after the rear end of the substrate passes the fourth conveying roller, so that the substrate does not make contact with the fourth conveying roller even if the fourth conveying roller is moved vertically upward.

18. The method of claim 11, wherein
the front end and the rear end of the substrate in the transferring direction are not in direct contact with the conveying rollers while the substrate is being transferred in the horizontal direction, so that the developer layer on the substrate does not flow from a top surface of the substrate to the conveying roller through the front end and the rear end.

19. The method of claim 11, wherein the substrate treating apparatus comprises sensor part, and
the sensor part senses the front end or the rear end of the substrate, and calculates a position of the front end or the rear end of the substrate in accordance with transferring of the substrate by using a rotation speed of the conveying rollers and a sensed position of the front end or the rear end of the substrate.

20. A method of treating a substrate using a substrate treating apparatus comprising a plurality of conveying rollers which transfer the substrate in a horizontal direction, the method comprising:
forming a developer layer by providing a developer onto the substrate on the conveying rollers positioned at a first height and in contact with a lower surface of the substrate; and
transferring the substrate on which the developer layer is formed in the horizontal direction by rotating the conveying rollers positioned at the first height, and
wherein as the substrate is transferred, the conveying rollers located at a second height which is lower than the first height and adjacent to a front end of the substrate is moved vertically upward to contact with a lower surface of the substrate, and
as the substrate is transferred, the conveying rollers located at the first height which is adjacent to a rear end of the substrate is moved away from the substrate and be located at the second height.

* * * * *